(12) United States Patent
Kim et al.

(10) Patent No.: US 9,337,199 B2
(45) Date of Patent: May 10, 2016

(54) SEMICONDUCTOR DEVICE AND METHOD OF FABRICATING THE SAME

(71) Applicants: Jiyoung Kim, Yongin-si (KR); Sungho Jang, Seoul (KR); Kang-Uk Kim, Seoul (KR); Kyung-Eun Kim, Seoul (KR); Daeik Kim, Hwaseong-si (KR); Hyoungsub Kim, Seongnam-si (KR); Nakjin Son, Suwon-si (KR); Dong Jin Lee, Seoul (KR); Yoosang Hwang, Suwon-si (KR); Jihye Hwang, Boryeong-si (KR)

(72) Inventors: Jiyoung Kim, Yongin-si (KR); Sungho Jang, Seoul (KR); Kang-Uk Kim, Seoul (KR); Kyung-Eun Kim, Seoul (KR); Daeik Kim, Hwaseong-si (KR); Hyoungsub Kim, Seongnam-si (KR); Nakjin Son, Suwon-si (KR); Dong Jin Lee, Seoul (KR); Yoosang Hwang, Suwon-si (KR); Jihye Hwang, Boryeong-si (KR)

(73) Assignee: Samsung Electronics Co., Ltd. (KR)

( * ) Notice: Subject to any disclaimer, the term of this patent is extended or adjusted under 35 U.S.C. 154(b) by 311 days.

(21) Appl. No.: 14/089,356

(22) Filed: Nov. 25, 2013

(65) Prior Publication Data
US 2014/0327087 A1 Nov. 6, 2014

(30) Foreign Application Priority Data
May 2, 2013 (KR) ........................ 10-2013-0049510

(51) Int. Cl.
*H01L 27/108* (2006.01)
*H01L 27/088* (2006.01)

(52) U.S. Cl.
CPC ...... *H01L 27/10826* (2013.01); *H01L 27/0886* (2013.01); *H01L 27/10894* (2013.01)

(58) Field of Classification Search
CPC ............ H01L 27/105; H01L 27/10844; H01L 27/10888; H01L 27/10894; H01L 27/10876
See application file for complete search history.

(56) References Cited

U.S. PATENT DOCUMENTS

| | | | |
|---|---|---|---|
| 6,121,086 A | 9/2000 | Kuroda et al. |
| 6,124,638 A | 9/2000 | Iwasa |
| 6,287,914 B1 | 9/2001 | Uchiyama et al. |
| 6,376,316 B2 | 4/2002 | Shukuri et al. |
| 6,433,381 B2 | 8/2002 | Mizutani et al. |
| 6,489,646 B1 | 12/2002 | Jang |
| 6,501,117 B1 | 12/2002 | Radens et al. |
| 6,646,313 B2 | 11/2003 | Shukuri et al. |
| 6,696,337 B2 | 2/2004 | Asano et al. |
| 6,858,893 B2 | 2/2005 | Ishibashi |
| 6,867,092 B2 | 3/2005 | Uchiyama et al. |

(Continued)

FOREIGN PATENT DOCUMENTS

| | | |
|---|---|---|
| JP | 2008-283112 | 11/2008 |
| KR | 1020050061221 | 6/2005 |

(Continued)

*Primary Examiner* — Jose R Diaz
(74) *Attorney, Agent, or Firm* — Myers Bigel & Sibley, P.A.

(57) ABSTRACT

A semiconductor device may include a substrate having a first region and a second region on a surface thereof, and a first semiconductor fin on the first region of the substrate with the first semiconductor fin including a first trench therethrough. A first gate electrode may be provided in the first trench, and first and second source/drain regions may be provided in the first semiconductor fin, with the first gate electrode between the first and second source/drain regions. A second semiconductor fin may be provided on the second region of the substrate with the second semiconductor fin including a second trench therethrough, a second gate electrode may be provided in the second trench, and third and fourth source/drain regions may be provided in the second semiconductor fin with the second gate electrode being between the third and fourth source/drain regions.

30 Claims, 18 Drawing Sheets

(56) References Cited

U.S. PATENT DOCUMENTS

| | | |
|---|---|---|
| 6,872,640 B1 | 3/2005 | Mouli |
| 7,034,408 B1 | 4/2006 | Schloesser |
| 7,348,235 B2 | 3/2008 | Fujiishi |
| 7,501,676 B2 | 3/2009 | Doyle |
| 7,728,373 B2 | 6/2010 | Seo et al. |
| 7,759,714 B2 | 7/2010 | Itoh et al. |
| 7,935,997 B2 | 5/2011 | McDaniel |
| 8,043,923 B2 | 10/2011 | Kim et al. |
| 8,058,683 B2 | 11/2011 | Yoon et al. |
| 8,063,425 B2 | 11/2011 | Kim et al. |
| 8,305,803 B2 | 11/2012 | Mazure et al. |
| 8,441,067 B2 | 5/2013 | Lin |
| 8,455,945 B2 | 6/2013 | Lee et al. |
| 8,492,833 B2 | 7/2013 | Ku |
| 2008/0283957 A1 | 11/2008 | Kang et al. |
| 2008/0284029 A1 | 11/2008 | Kim et al. |
| 2010/0193966 A1 | 8/2010 | Kim et al. |
| 2010/0210105 A1 | 8/2010 | Baek et al. |
| 2010/0213541 A1 | 8/2010 | Jeon et al. |
| 2012/0153363 A1 | 6/2012 | Shin |
| 2014/0061780 A1* | 3/2014 | Son .................. H01L 21/28008 257/330 |

FOREIGN PATENT DOCUMENTS

| | | |
|---|---|---|
| KR | 1020080087304 | 10/2008 |
| KR | 1020100092241 | 8/2010 |
| KR | 1020110015788 | 2/2011 |

* cited by examiner

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2013-0049510, filed on May 2, 2013, in the Korean Intellectual Property Office, the disclosure of which is hereby incorporated herein in its entirety by reference.

BACKGROUND OF THE INVENTION

Example embodiments of inventive concepts relate to semiconductor devices and methods of fabricating the same.

Due to their small-sized, multifunctional, and/or low-cost characteristics, semiconductor devices are important elements in the electronic industry. Higher integration of semiconductor memory devices is desired to satisfy consumer demands for increased performance and reduced prices. In the case of semiconductor memory devices, increased integration is especially desired, because their integration is an important factor in determining product prices. However, the expense of process equipment used to reduce pattern dimensions may limit further increases of integration for semiconductor memory devices. To address such limits, a variety of studies of new technologies have been conducted to further increase integration densities of semiconductor memory devices.

SUMMARY

Example embodiments of inventive concepts may provide semiconductor devices with reduced differences between heights of cell and peripheral regions.

Other example embodiments of inventive concepts may provide improved methods to fabricate the semiconductor devices.

According to example embodiments of inventive concepts, a semiconductor device may include a substrate having a cell array region and a peripheral circuit region, a cell gate electrode buried in the cell array region of the substrate, a first peripheral gate electrode buried in the peripheral circuit region of the substrate, and first peripheral source/drain regions provided in the substrate at both sides of the peripheral gate electrode.

In example embodiments, a bottom surface of the first peripheral gate electrode may have a concavo-convex structure. Stated in other words, a surface of the first peripheral gate electrode adjacent to the substrate may be raised at active regions of the substrate relative to portions of the surface between active regions.

In example embodiments, the first peripheral gate electrode may have a line-shaped structure elongated along a specific direction. The semiconductor device may further include at least one active fin provided below the first peripheral gate electrode, and the first peripheral gate electrode may be provided to face side and top surfaces of the active fin.

In example embodiments, the device may further include a device isolation layer provided below the first peripheral gate electrode to be in contact with the active fin. The device isolation layer may have a top surface that may be lower than that of the active fin, and the first peripheral source/drain region may have a bottom surface located at an intermediate level between the top surfaces of the device isolation layer and the active fin.

In example embodiments, the first peripheral gate electrode may be wider than the cell gate electrode.

In example embodiments, the first peripheral gate electrode may have a bottom surface that may be located at a different level from that of the cell gate electrode.

In example embodiments, the first peripheral gate electrode may have a top surface that may be lower than that of the substrate.

In example embodiments, the cell gate electrode and the first peripheral gate electrode may include at least one metal-containing layer.

In example embodiments, the cell gate electrode may have a top surface that may be located at a different level from that of the first peripheral gate electrode.

In example embodiments, the device may further include cell source/drain regions provided in the substrate at both sides of the cell gate electrode. The peripheral source/drain regions may have bottom surfaces that may be higher than those of the cell source/drain regions.

In example embodiments, the first peripheral gate electrode may include a material different from that of the cell gate electrode.

In example embodiments, the device may further include a second peripheral gate electrode provided in the substrate to be spaced apart from the first peripheral gate electrode. The first peripheral gate electrode may have a bottom surface that may be higher than bottom surfaces of the cell gate electrode and the second peripheral gate electrode. Here, a voltage applied to the second peripheral gate electrode may be higher than a voltage applied to the first peripheral gate electrode. Stated in other words, the second peripheral gate electrode may have a higher threshold voltage than the first peripheral gate electrode.

In other embodiments, the device may further include a second peripheral gate electrode provided in the substrate to be spaced apart from the first peripheral gate electrode. The first peripheral gate electrode may be configured to have a different work-function from the second peripheral gate electrode. Here, the first peripheral gate electrode may include a layer of lanthanum oxide, and the second peripheral gate electrode may include a layer of aluminum oxide.

In example embodiments, the semiconductor device may be a dynamic random access memory (DRAM) device.

According to example embodiments of inventive concepts, a method of fabricating a semiconductor device may include providing a substrate with a cell array region and a peripheral circuit region, forming a first trench in the cell array region of the substrate, forming a second trench in the peripheral circuit region of the substrate, forming a cell gate electrode and a peripheral gate electrode in the first and second trenches, respectively, and forming peripheral source/drain regions in portions of the substrate at both sides of the second trench.

In example embodiments, the first trench and the second trench may be formed in different steps.

In example embodiments, the first and second trenches may be formed to have different depths from each other.

In example embodiments, the method may further include forming a device isolation layer in the substrate to define active regions. The first trench and the second trench may be formed by etching the substrate and the device isolation layer. Here, the device isolation layer may be formed to have a top surface that may be located at a level lower than that of a top surface of the substrate, when measured below the first and second trenches.

According to some embodiments, a semiconductor device may include a substrate having a first region and a second region on a surface thereof, and a first semiconductor fin on the first region of the substrate wherein the first semiconductor fin includes a first trench therethrough. A first gate electrode may be provided in the first trench, and first and second source/drain regions may be provided in the first semiconductor fin, with the first gate electrode between the first and second source/drain regions. A second semiconductor fin may be provided on the second region of the substrate with the second semiconductor fin including a second trench therethrough. A second gate electrode may be provided in the second trench. Third and fourth source/drain regions may be provided in the second semiconductor fin with the second gate electrode being between the third and fourth source/drain regions.

A depth of the second trench into the second semiconductor fin may be less than a greatest height of the second semiconductor fin above the surface of the substrate, and portions of the second gate electrode may extend onto portions of sidewalls of the second semiconductor fin between the second trench and the surface of the substrate.

An isolation layer may be provided on the second region of the substrate adjacent to the second semiconductor fin, the second trench may extend through the second semiconductor fin and through the isolation layer on opposite sides of the second semiconductor fin, and a depth of the second trench in the isolation layer may be greater than a depth of the second trench in the second semiconductor fin.

A depth of the first trench into the first semiconductor fin may be less than a greatest height of the first semiconductor fin above the surface of the substrate, and portions of the first gate electrode may extend onto portions of sidewalls of the first semiconductor fin between the first trench and the surface of the substrate. In addition, an isolation layer may be provided on the first region of the substrate adjacent to the first semiconductor fin, the first trench may extend through the first semiconductor fin and through the isolation layer on opposite sides of the first semiconductor fin, and a depth of the first trench in the isolation layer may be greater than a depth of the first trench in the first semiconductor fin.

A width of the first trench may be less than a width of the second trench, and/or a width of the first gate electrode may be less than a width of the second gate electrode.

A depth of the first trench in the first semiconductor fin may be different than a depth of the second trench in the second semiconductor fin. A depth of the first trench in the first semiconductor fin may be greater than a depth of the second trench in the second semiconductor fin.

The second gate electrode may be recessed in the second trench.

Each of the first gate electrode and the second gate electrode may include at least one metal containing layer.

The first gate electrode may be recessed a first distance in the first trench, the second gate electrode may be recessed a second distance in the second trench, and the first and second distances may be different.

The first gate electrode may include a material not included in the second gate electrode, and/or the second gate electrode may include a material not included in the first gate electrode.

A third semiconductor fin may be provided on the second region of the substrate with the third semiconductor fin including a third trench therethrough, a third gate electrode may be provided in the third trench, and fifth and sixth source/drain regions may be provided in the third semiconductor fin with the third gate electrode being between the fifth and sixth source/drain regions.

A depth of the third trench into the third semiconductor fin may be greater than a depth of the second trench into the second semiconductor fin.

A first peripheral circuit transistor may be defined by the second gate electrode and the third and fourth source/drain regions, the first peripheral circuit transistor may have a first threshold voltage, a second peripheral circuit transistor may be defined by the third gate electrode and the fifth and sixth source/drain regions, the second peripheral circuit transistor may have a second threshold voltage, and the first and second threshold voltages may be different.

The second and third gate electrodes may have different work functions.

The second gate electrode may include lanthanum oxide, and the third gate electrode may include aluminum oxide.

The third and fourth source/drain regions may be n-type source/drain regions, and the fifth and sixth source/drain regions may be p-type source/drain regions. The third gate electrode may have a work function that is higher than a work function of the second gate electrode.

The first semiconductor fin may be aligned in a first direction, the second semiconductor fin may be aligned in a second direction, and the first and second directions may be non-parallel.

The first region may be a memory cell array region, and the second region may be a peripheral circuit region.

The first gate electrode may be a word line. In addition, a memory cell capacitor may include a memory cell storage node electrically coupled to the first source/drain region, and a bit line may be electrically coupled to the second source/drain region.

The first gate electrode and the first and second source/drain regions may define a memory cell transistor, and the second gate electrode and the third and fourth source/drain regions may define a peripheral circuit transistor.

Depths of the first and second source/drain regions into the first semiconductor fin may be greater than a depth of the first trench into the first semiconductor fin.

According to some other embodiments, a semiconductor memory device may include a substrate having a first region and a second region on a surface thereof, and a first semiconductor fin on the first region of the substrate with the first semiconductor fin including a first trench therethrough. A first gate electrode may be provided in the first trench, and first and second source/drain regions may be provided in the first semiconductor fin with the first gate electrode being between the first and second source/drain regions, and with the first gate electrode and the first and second source/drain regions defining a memory cell transistor. A second semiconductor fin may be provided on the second region of the substrate with the second semiconductor fin including a second trench therethrough. A second gate electrode may be provided in the second trench, and third and fourth peripheral circuit source/drain regions may be provided in the second semiconductor fin with the second gate electrode being between the third and fourth peripheral circuit source/drain regions, and with the second gate electrode and the third and fourth source/drain regions defining a first peripheral circuit transistor. A third semiconductor fin may be provided on the second region of the substrate with the third semiconductor fin including a third trench therethrough, and a third gate electrode may be provided in the third trench. Fifth and sixth source/drain regions may be provided in the third semiconductor fin with the third gate electrode being between the fifth and sixth source/drain regions, and with the third gate electrode and the fifth and sixth source/drain regions defining a second peripheral circuit transistor.

A depth of the third trench into the third semiconductor fin may be greater than a depth of the second trench into the second semiconductor fin.

The first peripheral circuit transistor may be defined by the second gate electrode, and the third and fourth source/drain regions may have a first threshold voltage. The second peripheral circuit transistor defined by the third gate electrode and the fifth and sixth source/drain regions may have a second threshold voltage, and the first and second threshold voltages may be different.

The second and third gate electrodes may have different work functions.

The second gate electrode may include lanthanum oxide, and the third gate electrode may include aluminum oxide.

The second and third source/drain regions may be n-type source/drain regions, and the fifth and sixth source/drain regions may be p-type source/drain regions.

The third gate electrode may have a work function that is higher than a work function of the second gate electrode.

The first semiconductor fin may be aligned in a first direction, the second semiconductor fin may be aligned in a second direction, and the first and second directions may be non-parallel.

The first region may be a memory cell array region, and the second region may be a peripheral circuit region.

The first gate electrode may be a word line. In addition, a memory cell capacitor may include a memory cell storage node electrically coupled to the first source/drain region, and a bit line may be electrically coupled to the second source/drain region.

According to some other embodiments, a semiconductor device may include a substrate with a first region and a second region on a surface thereof, and a first semiconductor fin on the first region of the substrate. A first gate electrode may extend across the first semiconductor fin, and first and second raised source/drain regions may be provided on the first semiconductor fin with the first gate electrode being between the first and second raised source/drain regions. A second semiconductor fin may be provided on the second region of the substrate with heights of the first and second fins being different, and a second gate electrode may extend across the second semiconductor fin, with work functions of the first and second gate electrodes being different. Third and fourth raised source/drain regions may be provided on the second semiconductor fin with the second gate electrode being between the third and fourth raised source/drain regions.

Each of the first and second semiconductor fins may include a first semiconductor material, and each of the first, second, third, and fourth raised source/drain regions may include a second semiconductor material, and the first and second semiconductor materials may be different.

Each of the first, second, third, and fourth raised source/drain regions may be a raised epitaxial source/drain region.

The first semiconductor material may include silicon, and the second semiconductor material may include silicon-germanium (SiGe).

The first region may be a memory cell array region, and the second region may be a peripheral circuit region.

The first gate electrode may be a word line. In addition, a memory cell capacitor may include a memory cell storage node electrically coupled to the first source/drain region, and a bit line may be electrically coupled to the second source/drain region.

The first gate electrode and the first and second source/drain regions may define a memory cell transistor, and the second gate electrode and the third and fourth source/drain regions may define a peripheral circuit transistor.

BRIEF DESCRIPTION OF THE DRAWINGS

Example embodiments will be more clearly understood from the following description taken in conjunction with the accompanying drawings. The accompanying drawings represent non-limiting, example embodiments as described herein.

FIGS. 3A through 6A are cross sectional views illustrating a process of fabricating a semiconductor device of FIG. 1, viewed along the section of FIG. 2A.

FIGS. 3B through 6B are cross sectional views illustrating a process of fabricating a semiconductor device of FIG. 1, viewed along the section of FIG. 2B.

Figure 1:
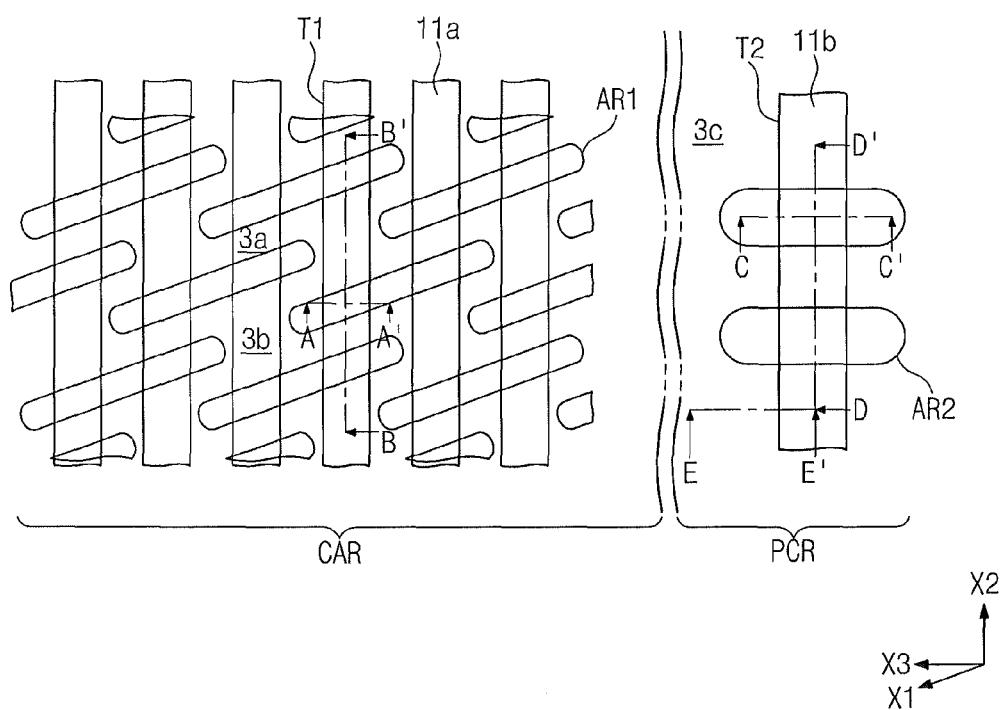
FIG. 1 is a plan view of a semiconductor device according to example embodiments of inventive concepts.

It should be noted that these figures are intended to illustrate general characteristics of methods, structures and/or materials used in certain example embodiments and to supplement the written description provided below. These drawings are not, however, to scale and may not precisely reflect the structural and/or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which example embodiments are shown. Example embodiments of inventive concepts may, however, be embodied in many different forms and should not be construed as being limited to the embodiments set forth herein; rather, these embodiments are provided so that this disclosure will be thorough and complete, and will fully convey concepts of example embodiments to those of ordinary skill in the art. In the drawings, the thicknesses of layers and regions may be exaggerated for clarity. Like reference numerals in the drawings denote like elements, and thus their repeated description may be omitted.

It will be understood that when an element/layer is referred to as being "connected" or "coupled" to another element/layer, it can be directly connected or coupled to the other element/layer or intervening elements/layers may be present. In contrast, when an element/layer is referred to as being "directly connected" or "directly coupled" to another element/layer, there are no intervening elements/layers present. Other words used to describe relationships between elements or layers should be interpreted in a like fashion (e.g., "between" versus "directly between," "adjacent" versus "directly adjacent," "on" versus "directly on"), etc. Like numbers indicate like elements/layers throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example Embodiments

Figure 2A:
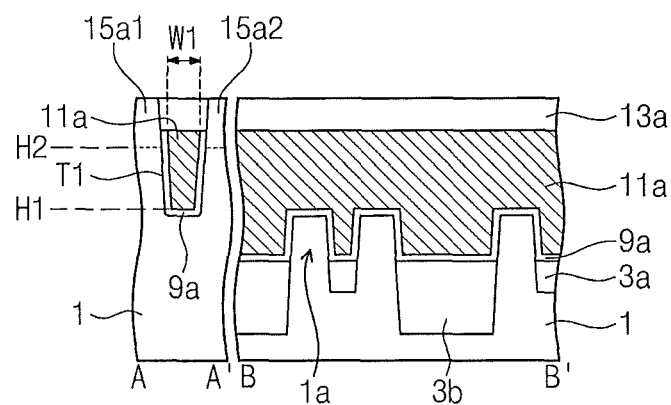
FIG. 2A is a cross sectional diagram illustrating sections taken along section lines A-A' and B-B' of FIG. 1.
Figure 2B:
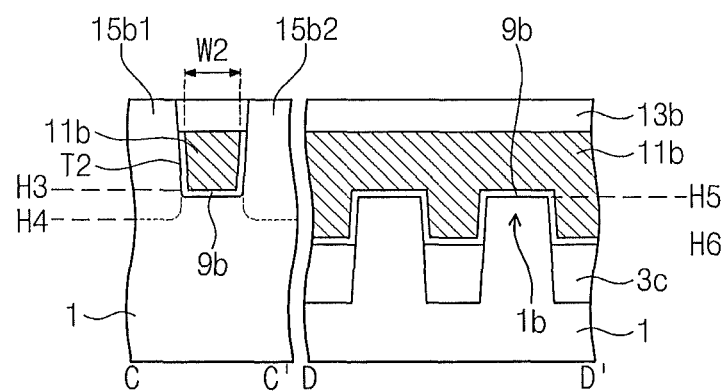
FIG. 2B is a cross sectional diagram illustrating sections taken along section lines C-C' and D-D' of FIG. 1.
Figure 2C:
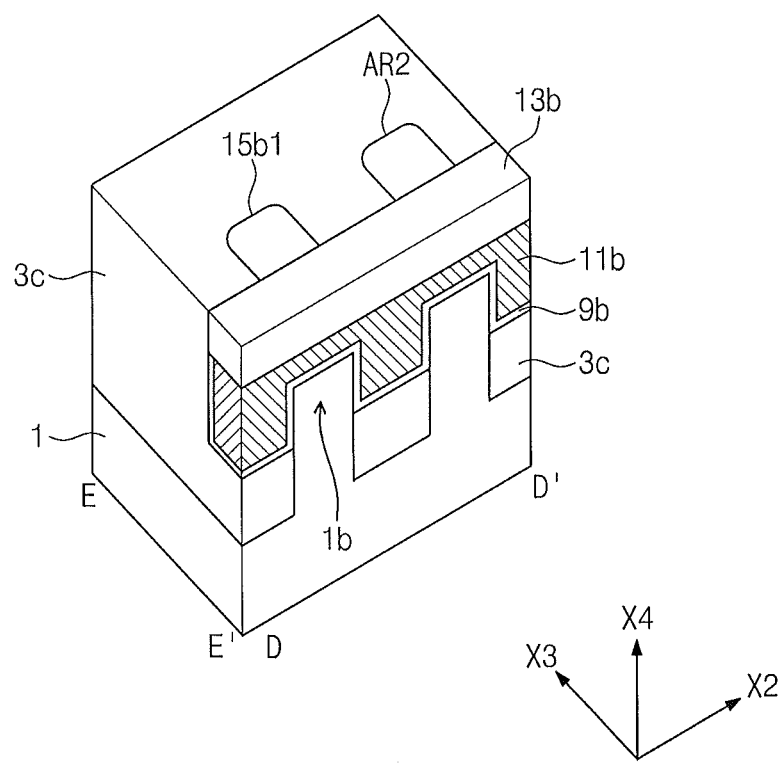
FIG. 2C is a perspective view illustrating a semiconductor device having sections of FIG. 2A taken along lines D-D' and E-E' of FIG. 1.
Figure 2D:
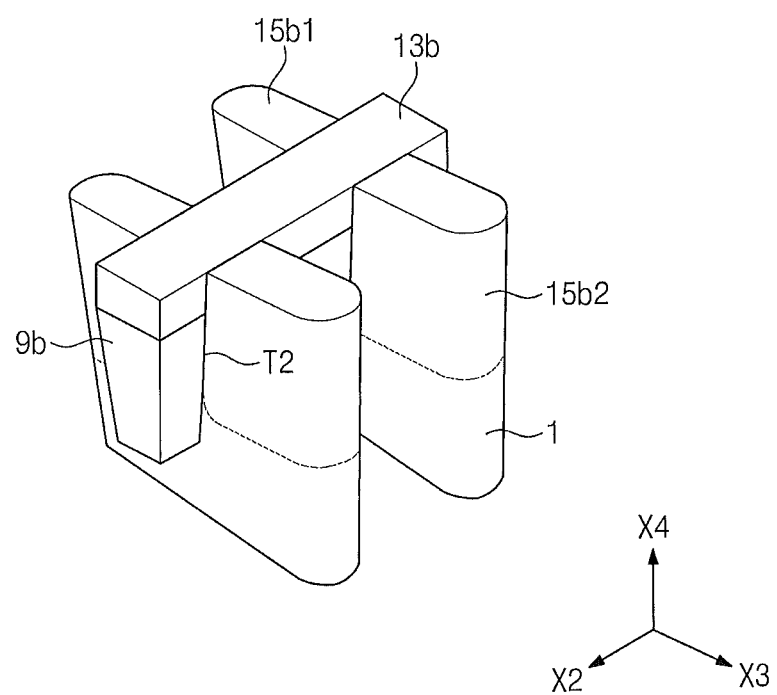
FIG. 2D is a perspective view of a semiconductor device, whose section is shaped like that of FIG. 2B.
Figure 3A:
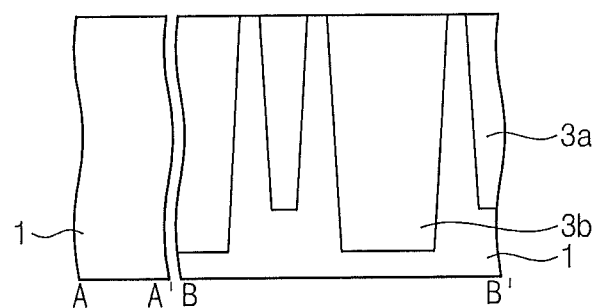
Figure 3B:
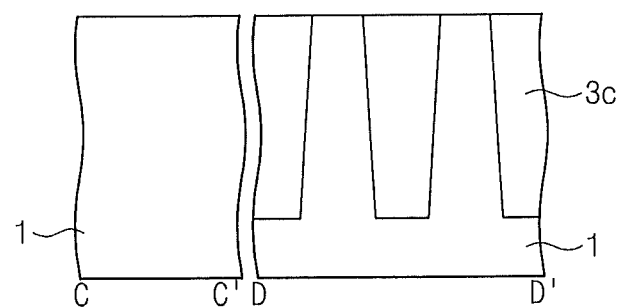
Figure 3C:
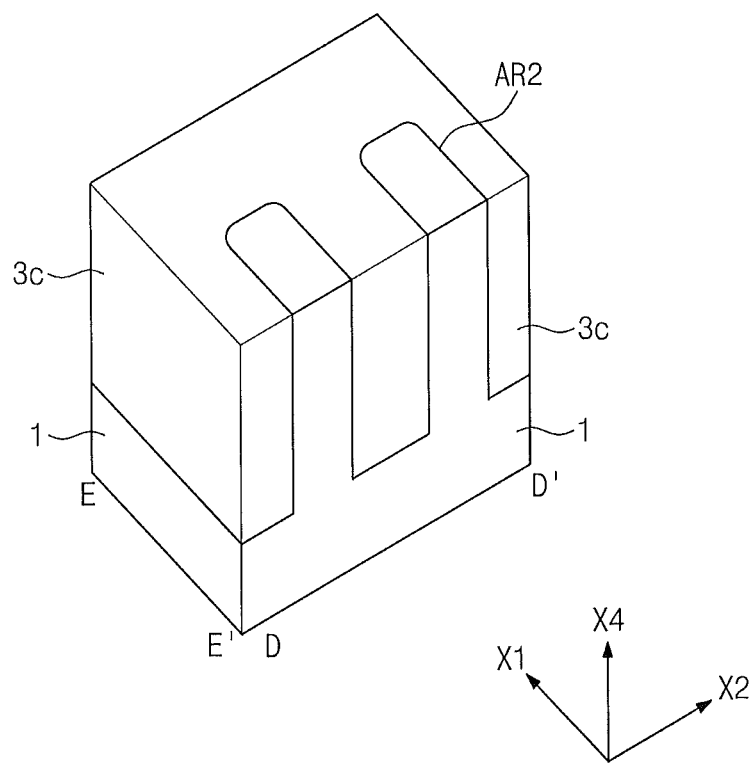
FIGS. 3C, 5C and 6C are perspective views illustrating a process of fabricating a, semiconductor device of FIG. 1, viewed along the section of FIG. 2C.

FIG. 1 is a plan view of a semiconductor device according to example embodiments of inventive concepts. FIG. 2A is a diagram illustrating cross sections taken along section lines A-A' and B-B' of FIG. 1. FIG. 2B is a diagram illustrating cross sections taken along section lines C-C' and D-D' of FIG. 1. FIG. 2C is a perspective view illustrating a semiconductor device having sections of FIG. 2A taken along section lines D-D' and E-E' of FIG. 1. FIG. 2D is a perspective view of a semiconductor device, having a section shaped like that of FIG. 2B.

Referring to FIGS. 1 and 2A, a substrate 1 may be provided to include a cell array region CAR and a peripheral circuit region PCR. On the substrate 1, device isolation layers 3a, 3b, and 3c may be provided to define cell active regions AR1 on the cell array region CAR and peripheral active regions AR2 on the peripheral circuit region PCR. The device isolation layers 3a, 3b, and 3c may include cell device isolation layers 3a and 3b and a peripheral device isolation layer 3c. The cell device isolation layers 3a and 3b may include a first cell device isolation layer 3a located between side surfaces of an adjacent pair of the cell active regions AR1 and a second cell device isolation layer 3b located between end portions of adjacent pairs of cell active regions AR1.

In the cell array region CAR, each of the cell active regions AR1 may be shaped like a bar elongated along a first direction X1 in plan view, and the cell active regions AR1 may be parallel to each other. Each cell active region AR1 may have a center located adjacent to an end portion of another cell active region(s) AR1. A plurality of first trenches T1 may be formed on the cell array region CAR of the substrate 1 to cross the cell device isolation layers 3a and 3b and extend along a second direction X2. The directions X1 and X2 may be non-orthogonal and non-parallel. Each of the first trenches T1 may be linear (i.e., shaped like a line). Cell gate electrodes or word lines 11a may be provided in the first trenches T1, respectively. A top surface of the cell gate electrode 11a may be located at a level lower than that of the substrate 1. A cell gate insulating layer 9a may be provided between the cell gate electrode 11a and the substrate 1. Respective cell active regions AR1 and cell gate electrodes 11A may thus intersect at an angle that is not 90 degrees (i.e., the cell active regions AR1 and the cell gate electrodes may be non-orthogonal and non-parallel).

Below each first trench T1, the substrate 1 may include a cell active fin 1a protruding from top surfaces of the cell device isolation layers 3a and 3b. The cell gate electrode 11a may cover top and side surfaces of the cell active fin 1a. A depth of the cell device isolation layers 3a and 3b may change from position to position, below the first trench T1. For example, the second device isolation layer(s) 3b may have a bottom surface that is located at a deeper level (relative to a surface of the substrate) than that of the first device isolation layer(s) 3a. Cell source and drain regions 15a1 and 15a2 may be provided in top portions of the substrate 1 and at opposite sides of the cell gate electrode 11a. A cell capping pattern 13a may be provided to cover a top surface of each cell gate electrode 11a. The cell capping pattern 13a may have a top surface that is coplanar with respect to a top surface of the substrate 1. The cell gate electrode 11a on the cell active fin 1a may have a bottom surface located at a first level H1. Each of the cell source/drain regions 15a1 and 15a2 may have a bottom surface located at a second level H2. The second level H2 may be higher than the first level H1. The cell gate electrode 11a may have a first width W1.

In example embodiments, the semiconductor device may be, for example, a dynamic random access memory (DRAM) device. Although not shown, the first cell source/drain region 15a1 may be electrically connected to a storage node contact of a memory cell capacitor, and the second cell source/drain region 15a2 may be electrically connected to a bit line.

Referring to FIGS. 1, 2B, 2C, and 2D, in the peripheral circuit region PCR, the peripheral active region AR2 may be shaped like a bar elongated along a third direction X3 crossing the first and second directions X1 and X2, in plan view. A second trench T2 may be provided in the peripheral circuit region PCR to cross the peripheral device isolation layer 3c and the peripheral active region AR2. A peripheral gate electrode 11b may be disposed in the second trench T2. A top surface of the peripheral gate electrode 11b may be lower than a top surface of the substrate 1. The peripheral capping pattern 13b may cover the top surface of the peripheral gate electrode 11b. A peripheral gate insulating layer 9b may be provided between the peripheral gate electrode 11b and the substrate 1.

Below the second trench T2, the substrate 1 may include a peripheral active fin 1b protruding from the top surface of the peripheral device isolation layer 3c. The peripheral gate electrode 11b may be provided on top and side surfaces of the peripheral active fin 1b in the trenches. Peripheral source/drain regions 15b1 and 15b2 may be provided in top portions of peripheral active fin 1b on opposite sides of the peripheral gate pattern 11b. Portions of the peripheral gate electrode 11b on the peripheral active fin 1b may have a bottom surface located at a third level H3. The third level H3 may be equivalent to or different from the first level H1. The peripheral source/drain regions 15b1 and 15b2 may have respective bottom surfaces located at a fourth level H4. The fourth level H4 may be lower than the third level H3. The peripheral active fin 1b may have a top surface located at a fifth level H5. Below the second trench T2, the peripheral device isolation layer 3c may have a top surface located at a sixth level H6. The fourth level H4 may be located at an intermediate level between the fifth and sixth levels H5 and H6. The peripheral gate electrode 11b may have a second width W2. The second width W2 may be equivalent to or different from the first width W1. In example embodiments, the second width W2 may be greater than the first width W1.

In certain embodiments, the top surface of the cell gate electrode 11a may be located at a different level from the top surface of the peripheral gate electrode 11b. Further, although FIGS. 1 and 2B through 2D show the peripheral gate electrode 11b provided to cross two peripheral active regions AR2 (or to cover two peripheral active fins 1b), the peripheral gate electrode 11b may be formed to cross one peripheral active region AR2 (or one peripheral active fin 1b). The gate electrodes 11a and 11b may include at least a metal-containing layer.

In semiconductor devices according to example embodiments of inventive concepts, both of the cell gate electrode 11a and the peripheral gate electrode 11b may be provided/recessed in the substrate, active region(s), and/or isolation layer(s), thereby allowing a reduction of a height difference between the cell array region CAR and the peripheral circuit region PCR. Accordingly, a final thickness of the semiconductor device may be reduced, and/or a stack-down effect may be achieved. Further, the reduction in height difference between two regions may allow simplification of subsequent wiring processes.

In addition, since the peripheral gate electrode 11b has a gate electrode structure of fin-FET (fin field effect transistor), the device can have an improved short channel effect.

FIGS. 3A through 6A are cross sectional views illustrating operations of fabricating a portion of a semiconductor device having a cross section shaped like that of FIG. 2A, FIGS. 3B through 6B are cross sectional views illustrating operations of fabricating a portion of a semiconductor device having a cross section shaped like that of FIG. 2B, and FIGS. 3C, 5C and 6C are perspective views illustrating operations of fabricating a portion of a semiconductor device of FIG. 2C.

Referring to FIGS. 1, and 3A through 3C, the device isolation layers 3a, 3b, and 3c may be formed on the substrate 1 with the cell array region CAR and the peripheral circuit region PCR to define the active regions AR1 and AR2. In example embodiments, all of the device isolation layers 3a, 3b, and 3c may be simultaneously formed by using a same process(es)/operation(s). In other embodiments, at least one of the device isolation layers 3a, 3b, and 3c may be formed using a process(es)/operation(s) different than that used to form one or both of the other isolation layers. The cell device isolation layers 3a and 3b may be formed on the cell array region CAR and may have a depth varying from position to position.

Figure 4A:
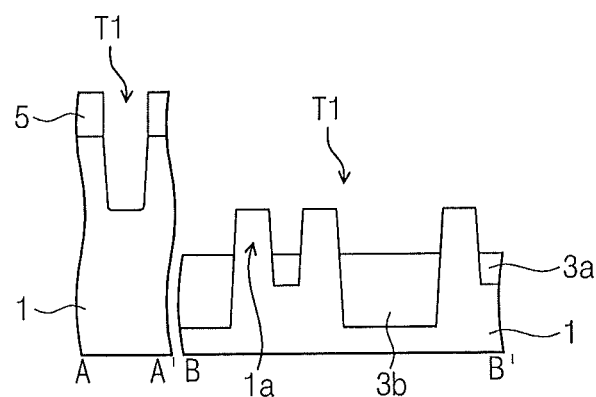
Figure 4B:
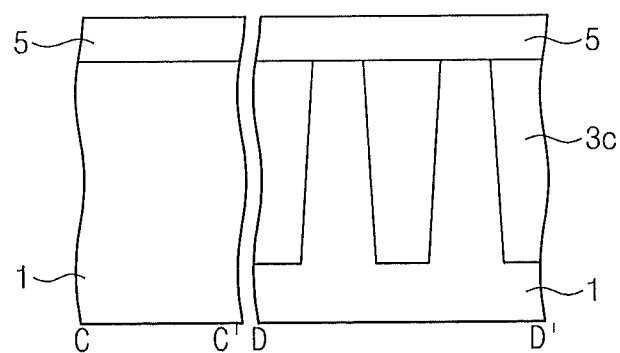
Figure 5A:
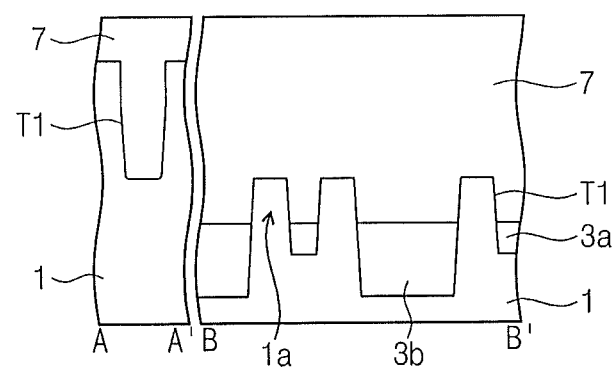
Figure 5B:
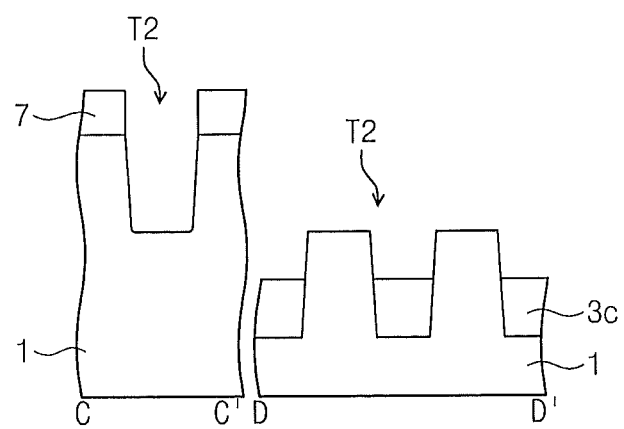
Figure 5C:
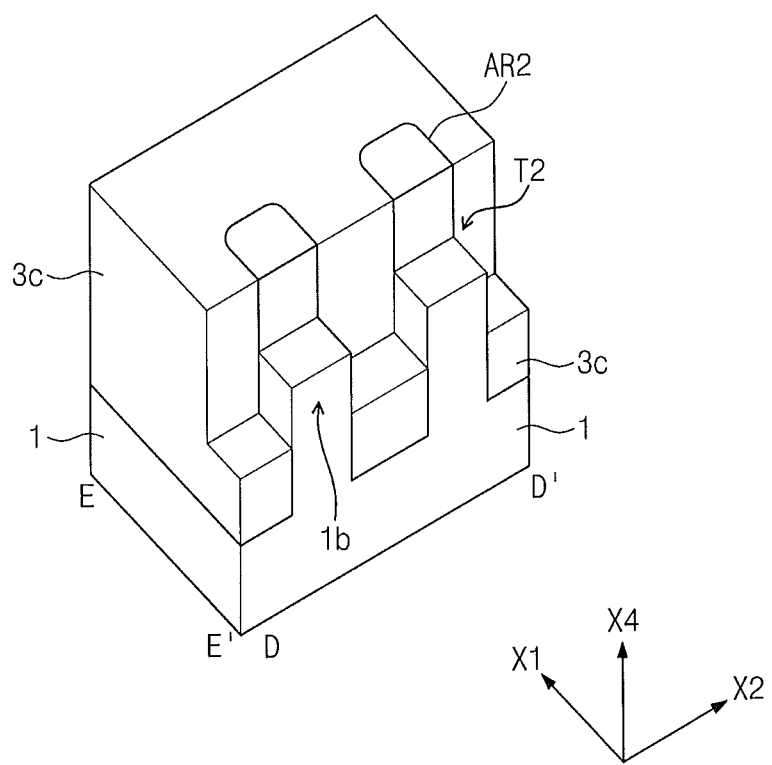
Figure 6A:
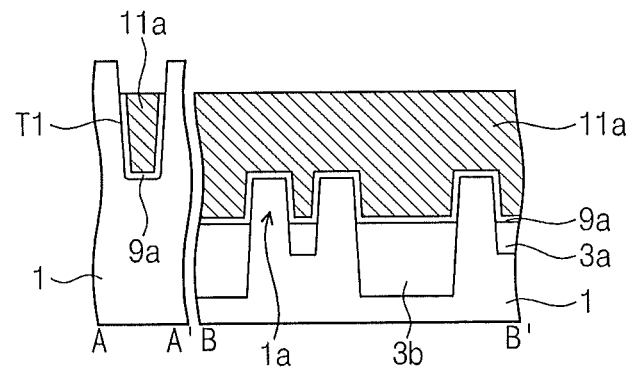
Figure 6B:
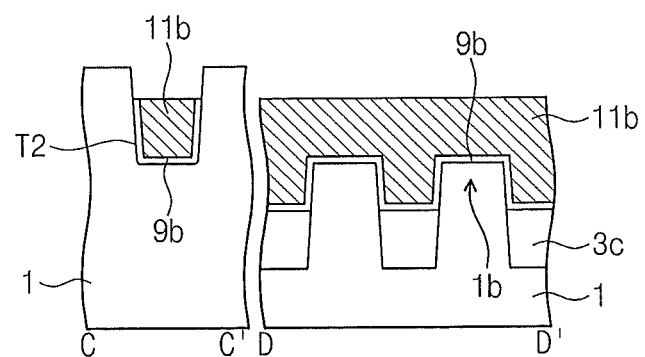
Figure 6C:
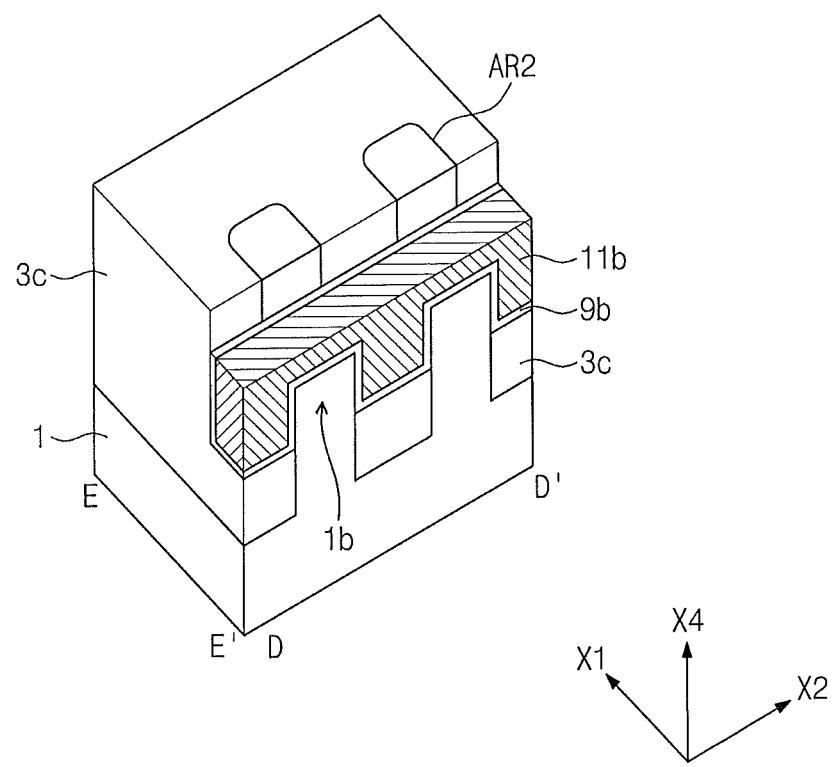

Referring to FIGS. 1, 4A, and 4B, a first mask pattern 5 may be formed on the substrate 1. The first mask pattern 5 may be formed of a material having an etch selectivity with respect to the substrate 1 and the device isolation layers 3a, 3b, and 3c. The first mask pattern 5 may be formed to cover the peripheral circuit region PCR and expose regions of the cell array region CAR where the cell gate electrodes 11a will be formed. For example, the first mask pattern 5 may define/expose a plurality of line-shaped patterns on the cell array region CAR. The cell device isolation layers 3a and 3b and the substrate 1 may be etched using the first mask pattern 5 as an etch mask to form first trench(es) T1. This etching process may be performed using an etch recipe prepared such that an etch rate of the cell device isolation layers 3a and 3b is higher than that of the substrate 1. Alternatively, the exposed portions of the cell device isolation layers 3a and 3b may be etched first using the first mask pattern 5 as an etch mask to have a first depth, and then, the substrate 1 may be etched to have a second depth that is shallower than the first depth. As a result, a plurality of cell active fins 1a may be formed across bottom portions of first trench(es) T1.

Referring to FIGS. 1 and 5A through 5C, first mask pattern 5 may be removed to expose device isolation layers 3a, 3b, and 3c and substrate 1, and then a second mask pattern 7 may be formed on the substrate 1. Similar to the first mask pattern 5, the second mask pattern 7 may be formed of a material having an etch selectivity with respect to device isolation layers 3a, 3b, and 3c and substrate 1. The second mask pattern 7 may be formed to cover the cell array region CAR and expose regions of the peripheral circuit region PCR where the peripheral gate electrodes 11b will be formed. The peripheral device isolation layer 3c and the substrate 1 may be etched using the second mask pattern 7 as an etch mask to form the second trench(es) T2. Here, this etching process may be performed using an etch recipe such that an etch rate of the peripheral device isolation layer 3c is higher than that of the substrate 1. Alternatively, the exposed portion of the peripheral device isolation layer 3c may be etched first using the second mask pattern 7 as an etch mask to have a third depth, and then, the substrate 1 may be etched to have a fourth depth that is less than the third depth. As a result, a plurality of peripheral active fins 1b may be formed across bottom portions of the second trench(es) T2.

Since the first and second trenches T1 and T2 are formed using two different mask patterns 5 and 7, they may be formed to have different depths. If the first and second trenches T1 and T2 are simultaneously formed using a single mask pattern, they may be formed to have a same depth.

Referring to FIGS. 1 and 6A through 6C, the second mask pattern 7 may be removed. A gate insulating layer may be conformally formed on the substrate 1. A conductive layer may then be formed on the gate insulating layer to fill the first trench(es) T1 and the second trench(es) T2. Next, an etch-back process may be performed to partially remove the conductive layer and the gate insulating layer. As a result, the cell gate insulating layer 9a and the cell gate electrode 11a may be formed in the first trench(es) T1, and the peripheral gate insulating layer 9b and the peripheral gate electrode 11b may be formed in the second trench(es) T2. In example embodiments, upper sidewalls of the first and second trenches T1 and T2 may be exposed by etching the conductive layer back below a level of the trench opening.

In other embodiments, the cell array region CAR and the peripheral circuit region PCR may be etched using respective different etch-back operations. In this case, the cell gate electrode 11a may be formed to have a top surface that is located at a different level than that of the peripheral gate electrode 11b.

Thereafter, as described with reference to FIGS. 2A through 2D, a capping layer may be formed on the substrate 1 to fill the first and second trenches T1 and T2, and then, an etching process may be performed to expose top surfaces of the substrate 1 and the device isolation layers 3a, 3b, and 3c to form the cell capping layer 13a on the cell gate electrode 11a and the peripheral capping layer 13b on the peripheral gate electrode 11b. Although top surfaces of the capping layers 13a and 13b are shown to be coplanar with top surfaces of active regions of the substrate 1, the capping layers 13a and 13b may be formed to protrude above top surfaces of active regions of the substrate 1.

The semiconductor device of FIGS. 1 and 2A through 2D may be fabricated using operations discussed above with respect to FIGS. 3A-C, 4A-B, 5A-C, and 6A-C. Thereafter, a wiring structure may be formed on the cell array region CAR and the peripheral circuit region PCR. Because there may be relatively little/no height difference between the regions CAR and PCR, operations of forming wiring may be performed with reduced risk of mask misalignment. In addition, a final thickness of the semiconductor device may be reduced and/or integration density may be increased.

Other Example Embodiments

Figure 7:
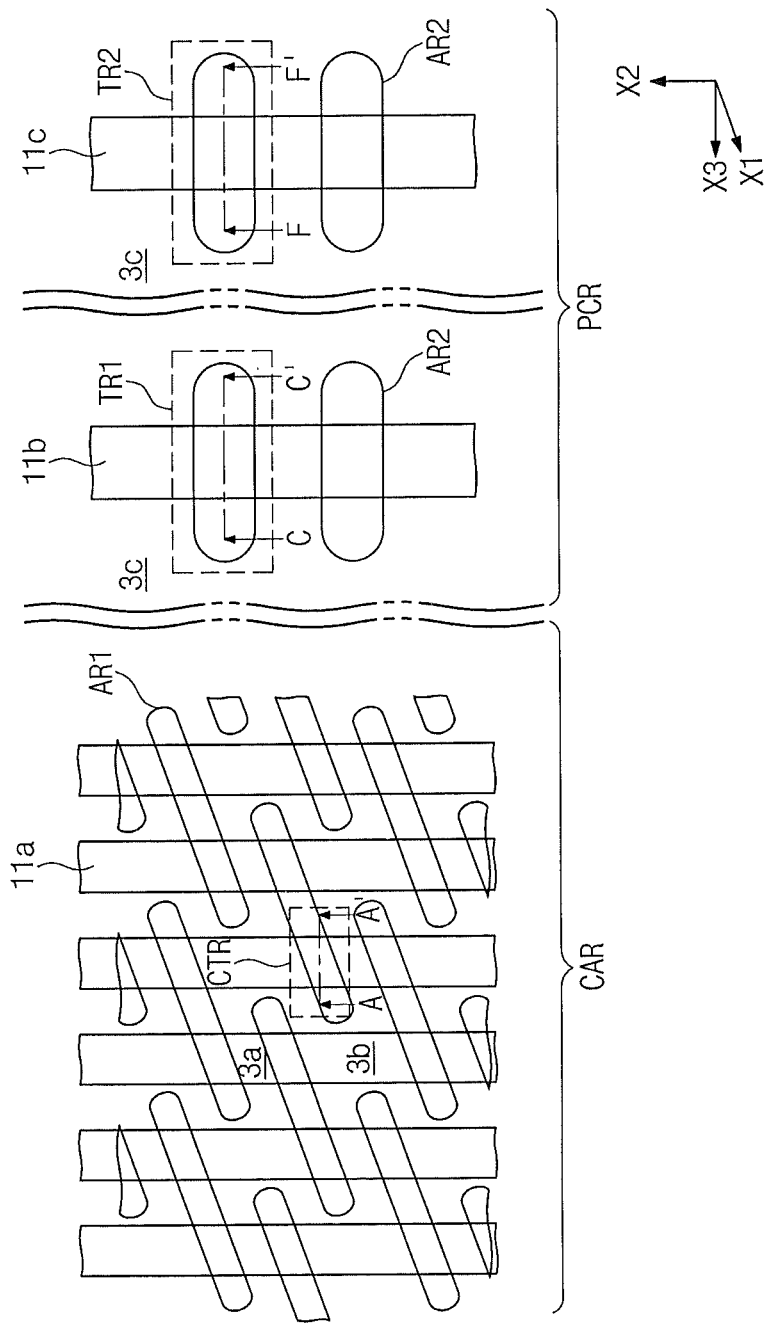
FIG. 7 is a plan view of a semiconductor device according to other example embodiments of inventive concepts.
Figure 8A:
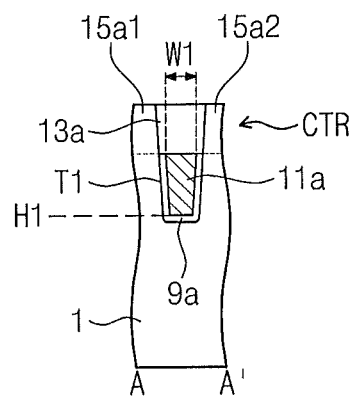
FIGS. 8A through 8C are cross sectional views taken along lines A-A', C-C', and F-F' of FIG. 7, respectively.
Figure 8B:
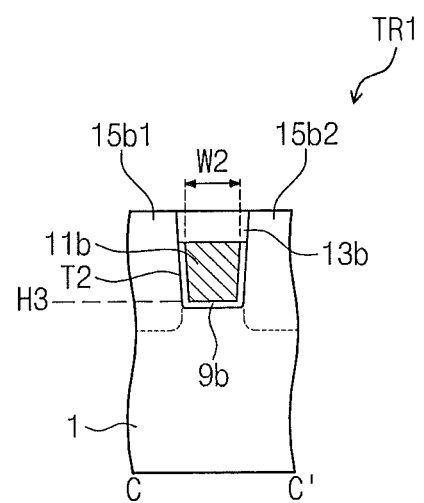
Figure 8C:
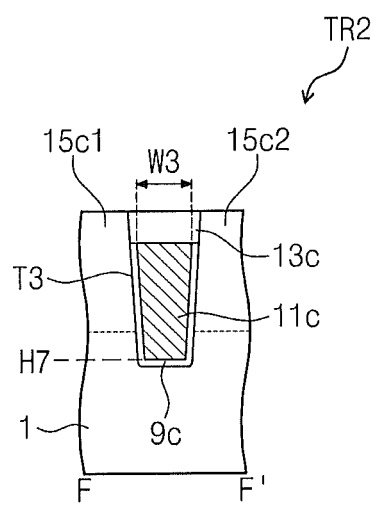

FIG. 7 is a plan view of a semiconductor device according to other example embodiments of inventive concepts. FIGS. 8A, 8B, and 8C are sectional views taken along lines A-A', C-C', and F-F' of FIG. 7, respectively.

Referring to FIGS. 7 and 8A, a unit cell transistor CTR may be provided on the cell array region CAR to include the cell gate electrode 11a, the cell gate insulating layer 9a, and the cell source/drain regions 15a1 and 15a2, as described with reference to FIG. 2A. A cell capping layer 13a may be provided on the cell gate electrode 11a.

Referring to FIGS. 7, 8B, and 8C, a first peripheral transistor TR1 and a second peripheral transistor TR2 may be provided, spaced apart from each other, on the peripheral circuit region PCR. The first peripheral transistor TR1 may include the first peripheral gate electrode 11b and the first peripheral source/drain regions 15b1 and 15b2, which may be provided in a top portion of the active region of substrate 1 and at opposite sides of the first peripheral gate electrode 11b, as described with reference to FIG. 2B. The first peripheral gate electrode 11b may be disposed in the second trench T2 of the substrate 1. A first peripheral capping layer 13b may be provided on the first peripheral gate electrode 11b. In example embodiments, the first peripheral transistor TR1 may be a low voltage transistor configured to be operated at a relatively low voltage. Stated in other words, the first peripheral transistor may have a relatively low threshold voltage.

The second peripheral transistor TR2 may include a second peripheral gate electrode 11c, which may be provided in the active region of substrate 1, and second peripheral source/drain regions 15c1 and 15c2, which may be provided in the top portion of the active region of substrate 1 and at opposite sides of the second peripheral gate electrode 11c. A third trench T3 may be provided in the top portion of the active region of substrate 1, and the second peripheral gate electrode 11c may be disposed in the third trench T3. The third trench T3 may be formed to have technical features similar to those of the second trench T2 according to example embodiments of inventive concepts. A second peripheral gate insulating layer 9c may be interposed between the substrate 1 and the second peripheral gate electrode 11c. A second peripheral capping layer 13c may be provided on the second peripheral gate electrode 11c. In example embodiments, the second peripheral transistor TR2 may be a high voltage transistor configured to be operated at a relatively high voltage. Stated in other words, the second peripheral transistors may have a relatively high threshold voltage. Accordingly, a threshold voltage of the second peripheral transistor TR2 may be greater than a threshold voltage of the first peripheral transistor TR1.

The peripheral gate electrodes 11b and 11c may have widths W2 and W3 that are greater than the width W1 of the cell gate electrode 11a. According to some embodiments, W1 may be in the range of 10 nm to 30 nm, and W2 and W3 may each be at least 10 nm. For example, W1 may be no greater than 30 nm, and W2 and W3 may be at least 40 nm.

To reduce/prevent gate-induced drain leakage (GIDL) and resulting leakage currents in the cell transistor CTR, a portion of the first cell source/drain region 15a1 may be scaled down to horizontally overlap the cell gate electrode 11a. To provide this structure, the first level H1 of the bottom surface of the cell gate electrode 11a may be lowered. Accordingly, a depth of the cell gate electrode 11a into the active region of substrate 1 may be greater than depths of cell source/drain regions 15a1 and 15a2 into the active region of substrate 1.

To reduce a parasitic resistance of the first peripheral transistor TR1, which may be a low voltage transistor, portions of the first peripheral source/drain regions 15b1 and 15b2 may be scaled up to horizontally overlap the first peripheral gate electrode 11b. To provide this structure, the third level H3 of the bottom surface of the first peripheral gate electrode 11b may be elevated relative to bottom surfaces of source/drain regions 15b1 and 15b2. For example, the third level H3 may be higher than the first level H1. Accordingly, a depth of the first peripheral gate electrode 11b into the active region of substrate 1 may be less than depths of first peripheral source/drain regions 15b1 and 15b2 into the active region of substrate 1.

To overcome/reduce a short channel effect in the second peripheral transistor TR2, which may be a high voltage transistor, a seventh level H7 of the bottom surface of the second peripheral gate electrode 11c may be lower than the third level H3. According to some embodiments, a depth of cell gate electrode 11a in the trench on active region AR1 (at level H1) may be in the range of 150 nm to 200 nm, a depth of peripheral gate electrode 11b in the trench on active region AR2 (at level H3) may be in the range of 50 nm to 100 nm, and a depth of peripheral gate electrode 11c in the trench on active region AR2 (at level H7) may be in the range of 150 nm to 200 nm. Depths of gate electrodes 11a and 11c into respective trenches on respective active regions may thus be at least 150 nm, and a depth of gate electrode 11b into the respective trench in the respective active region may be no more than about 100 nm.

Thicknesses of the capping layers 13a, 13b, and 13c may be the same or different. For example, the cell capping layer 13a may be thicker than the first peripheral capping layer 13b. By way of example, cell capping layers 13a and 13c may have thicknesses of at least 50 nm (e.g., in the range of 50 nm to 100 m), and cell capping layer 13b may have a thickness no greater than 40 nm (e.g., in the range of 0 nm to 40 nm).

Example embodiments of inventive concepts may be applied to provide high and low voltage transistors (having respective high and low threshold voltages) on the peripheral circuit region.

Semiconductor devices and methods of fabricating the same may be identical or similar to those of previous embodiments, except for the differences described above.

Still Other Example Embodiments

Figure 9A:
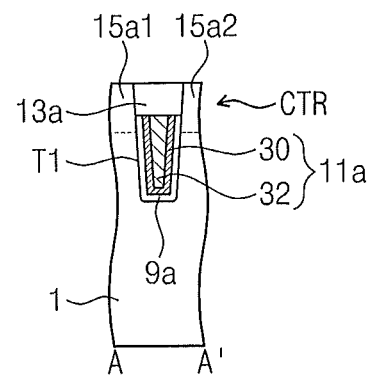
FIGS. 9A through 9C are cross sectional views taken along lines A-A', C-C', and F-F' of FIG. 7, respectively, illustrating a semiconductor device according to still other example embodiments of inventive concepts.
Figure 9B:
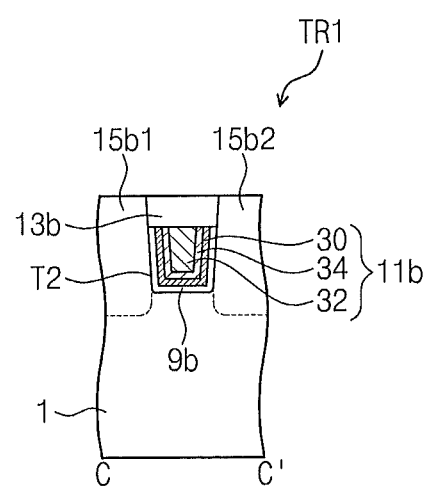
Figure 9C:
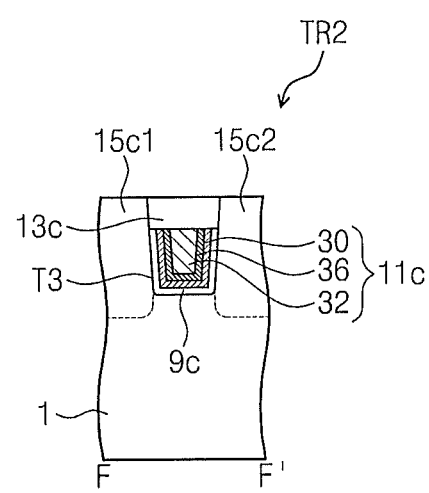

FIGS. 9A through 9C are sectional views taken along lines A-A', C-C', and F-F' of FIG. 7, respectively, to describe a semiconductor device according to still other example embodiments of inventive concepts.

Referring to FIGS. 7 and 9A through 9C, a semiconductor device may include transistors CTR, TR1, and TR2, whose gate electrodes 11a, 11b, and 11c are configured to have different work-functions. For example, the gate electrodes 11a, 11b, and 11c may be formed of different materials having different work functions. In example embodiments, the first peripheral transistor TR1 may be an NMOS transistor, and the second peripheral transistor TR2 may be a PMOS transistor.

For example, the cell gate electrode 11a may include a first metal-containing layer 30 in contact with the cell gate insulating layer 9a and a second metal-containing layer 32 filling the first trench T1.

The first peripheral gate electrode 11b may include the first metal-containing layer 30 in contact with the first peripheral gate insulating layer 9b, the second metal-containing layer 32 filling the second trench T2, and a third metal-containing layer 34 between the first metal-containing layer 30 and the second metal-containing layer 32.

The second peripheral gate electrode 11c may include the first metal-containing layer 30 in contact with the second peripheral gate insulating layer 9c, the second metal-containing layer 32 filling the third trench T3, and a fourth metal-containing layer 36 interposed between the first metal-containing layer 30 and the second metal-containing layer 32.

The first metal-containing layer 30 may be formed of, for example, a titanium nitride layer. The second metal-containing layer 32 may be formed of, for example, a tungsten layer.

In embodiments where the first peripheral transistor TR1 is an NMOS transistor, a portion of the substrate 1 below the first peripheral gate electrode 11b may be doped with p-type impurities, and the first peripheral source/drain regions 15b1 and 15b2 may be doped with n-type impurities. In example embodiments, the first peripheral gate electrode 11b may have a work-function that is similar or equivalent to that of an n+ polysilicon layer highly doped with n-type impurities. For example, the first peripheral gate electrode 11b may be configured to have a work-function of about 4.1 eV. For this, the third metal-containing layer 34 may include, for example, lanthanum oxide ($La_2O_3$) to lower a threshold voltage of the first peripheral transistor TR1. In other words, the first peripheral transistor TR1 can be operated at a relatively low voltage.

In the case where the second peripheral transistor TR2 is a PMOS transistor, a portion of the substrate 1 below the second peripheral gate electrode 11c may be doped with n-type impurities, and the second peripheral source/drain regions 15c1 and 15c2 may be doped with p-type impurities. In example embodiments, the second peripheral gate electrode 11c may have a work-function that is similar or equivalent to that of a p+ polysilicon layer highly doped with p-type impurities. For example, the second peripheral gate electrode 11c may be configured to have a work-function of about 5.3 eV. For this, the fourth metal-containing layer 36 may include, for example, aluminum oxide ($Al_2O_3$) to lower a threshold voltage of the second peripheral transistor TR2. In other words, the second peripheral transistor TR2 can be operated at a relatively low voltage.

In example embodiments, the first and second peripheral transistors TR1 and TR2 may be configured to realize CMOS circuits.

Semiconductor devices and methods of fabricating the same may be identical or similar to those of the previous embodiments, except for the differences described above.

In the drawings, portions of the active fins 1a and 1b between the gate electrodes 11a/11b and the substrate 1 were shown to have top surfaces located below top surfaces of the active fins 1a/1b spaced apart from electrodes 11a/11b. However, in certain embodiments, portions of the active fins 1a and 1b between the gate electrodes 11a/11b and the substrate 1 may have the top surfaces located over top surfaces of the active fins 1a/1b spaced apart from electrodes 11a/11b.

Semiconductor memory devices disclosed above may be encapsulated using various and diverse packaging techniques. For example, semiconductor memory devices according to the aforementioned embodiments may be encapsulated using any one of a package on package (POP) technique, a ball grid array (BGA) technique, a chip scale package (CSP) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi-chip package (MCP) technique, a wafer-level fabricated package (WFP) technique, and a wafer-level processed stack package (WSP) technique.

A package in which a semiconductor memory device according to any of the above embodiments is mounted may further include at least one semiconductor device (e.g., a controller and/or a logic device) that controls the semiconductor memory device.

Figure 10:
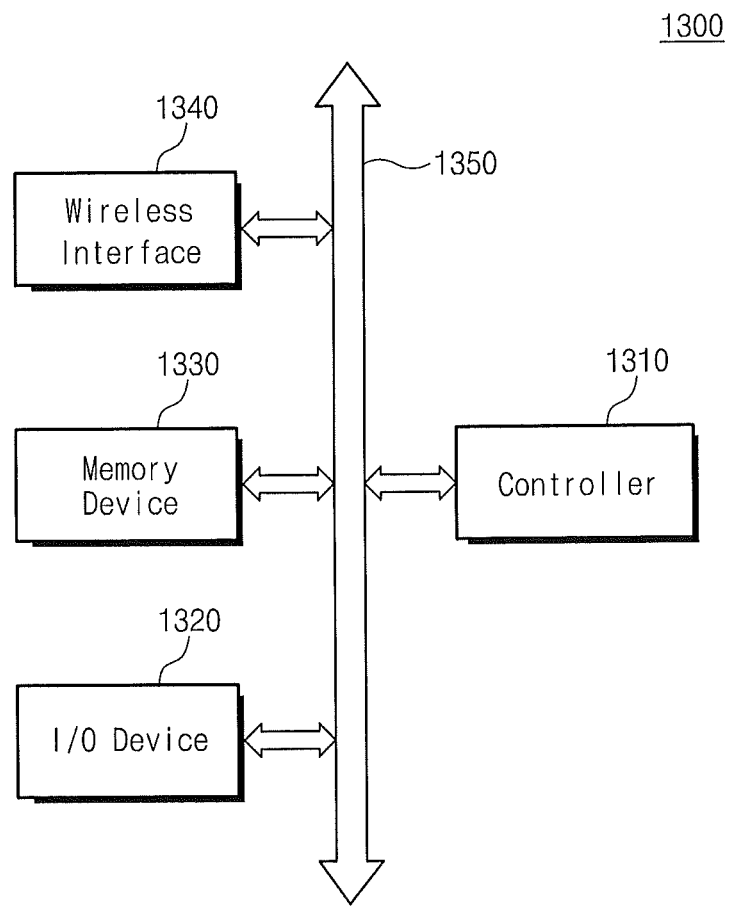
FIG. 10 is a block diagram schematically illustrating electronic devices including a semiconductor device according to example embodiments of inventive concepts.

FIG. 10 is a block diagram schematically illustrating electronic devices including a semiconductor device according to example embodiments of inventive concepts discussed above.

Referring to FIG. 10, an electronic device 1300 including a semiconductor device according to example embodiments of inventive concepts may be used in one of a personal digital assistant (PDA), a laptop computer, a mobile computer, a web tablet, a wireless phone, a cell phone, a digital music player, a wired or wireless electronic device, or a complex electronic device including functionalities of at least two of the device types mentioned above. The electronic device 1300 may include a controller 1310, an input/output device 1320 (such as a keypad, a keyboard, a display, etc.), a memory 1330, and a wireless interface 1340 that are coupled through a bus 1350. The controller 1310 may include, for example, at least one microprocessor, a digital signal process or, a microcontroller, etc. The memory 1330 may be configured to store a command code(s) to be used by the controller 1310 and/or user data. The memory 1330 may include a semiconductor device having a vertical channel transistor according to example embodiments of inventive concepts. The electronic device 1300 may use wireless interface 1340 to transmit data to and/or receive data from a wireless communication network using a radio frequency (RF) signal. The wireless interface 1340 may include, for example, an antenna, a wireless transceiver, etc. The electronic system 1300 may be used according to a communication interface protocol in a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Figure 11:
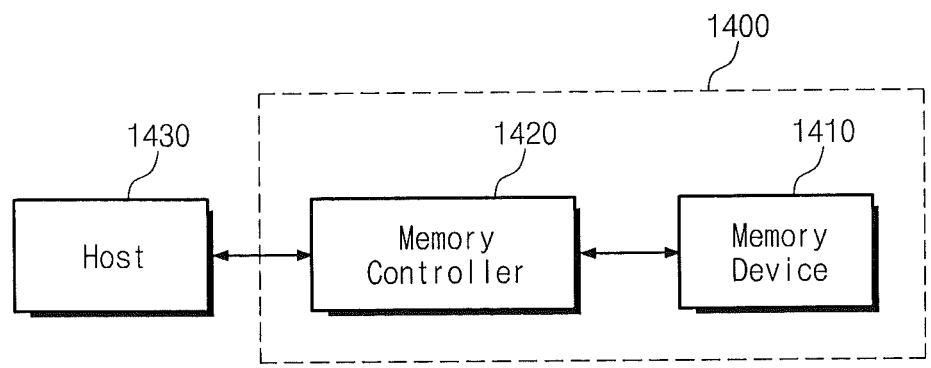
FIG. 11 is a block diagram schematically illustrating memory systems including a semiconductor device according to example embodiments of inventive concepts.

FIG. 11 is a block diagram schematically illustrating memory systems including a semiconductor device according to example embodiments of inventive concepts.

Referring to FIG. 11, a memory system including a semiconductor device according to example embodiments of inventive concepts will be described. The memory system 1400 may include a memory device 1410 that may be used to store relatively large amounts of data and a memory controller 1420. The memory controller 1420 controls the memory device 1410 to read data stored in the memory device 1410 or to write data into the memory device 1410 in response to read/write requests of a host 1430. The memory controller 1420 may include an address mapping table to map an address provided from the host 1430 (e.g., a mobile device or a computer system) into a physical address of the memory device 1410. The memory device 1410 may be a semiconductor device including a vertical channel transistor according to example embodiments of inventive concepts.

According to example embodiments of inventive concepts, the semiconductor device may include a cell gate electrode and a peripheral gate electrode that are buried in the substrate, and thus, a height difference between the cell array region and the peripheral circuit region may be reduced. A final thickness of the semiconductor device may thus be reduced and/or a stack-down effect may be achieved. In addition, a reduction in height differences between the two regions may facilitate subsequent wiring processes.

According to other example embodiments of inventive concepts, the peripheral gate electrode of the semiconductor device may be provided in the form of a gate electrode structure for a fin-FET and thus, the device can provide improved short channel effect characteristics.

According to still other example embodiments of inventive concepts, the semiconductor device may include peripheral transistors that are configured to have structural features different from those of cell transistors. Accordingly, a circuit including both high and low voltage transistors and/or including CMOS transistors may be provided.

According to some additional embodiments illustrated in FIGS. 12A, 12B, 13A, and 13B, a semiconductor device may include substrate 1101, first semiconductor fin 1113 on a first region of substrate 1101, and second semiconductor fin 1123 on a second region of substrate 1101, with first and second fins 1113 and 1123 having different heights H1 and H2 relative to a surface of substrate 1101. First gate electrode 1115 may extend across first semiconductor fin 1113, and first and second raised source/drain regions 1111a and 1111b may be provided on first semiconductor fin 1113 wherein first gate electrode 1115 is between first and second raised source/drain regions 1111a and 1111b. Second gate electrode 1125 may extend across second semiconductor fin 1123, and third and fourth raised source/drain regions 1121a and 1121b may be provided on second semiconductor fin 1123 wherein second gate electrode 1125 is between third and fourth raised source/drain regions 1121a and 1121b. Moreover, work functions of first and second gate electrodes 1115 and 1125 may be different. While height H1 is shown as being greater than height H2 according to some embodiments, H2 may be greater than H1 according to some other embodiments.

Each of first and second semiconductor fins 1113 and 1123 may include a first semiconductor material, and each of first, second, third, and fourth raised source/drain regions 1111a, 1111b, 1121a, and 1121b may include a second semiconductor material, and the first and second semiconductor materials may be different. Moreover, each of first, second, third, and fourth raised source/drain regions 1111a, 1111b, 1121a, and 1121b may be a raised epitaxial source/drain region. In addition, the first semiconductor material may be silicon and the second semiconductor material may be silicon-germanium (SiGe).

Figure 12A:
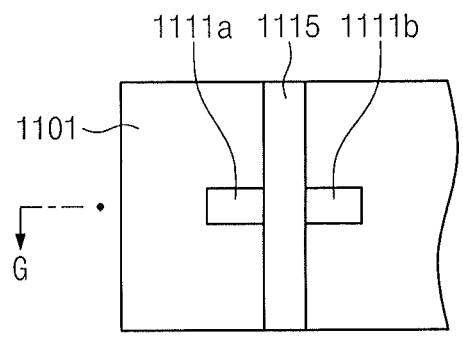
FIGS. 12A and 12B are plan views of first and second regions of a semiconductor device according to some embodiments of inventive concepts.
Figure 12B:
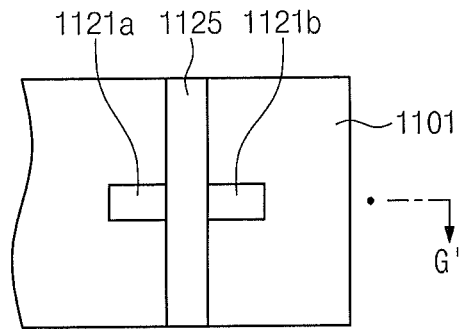
Figure 13A:
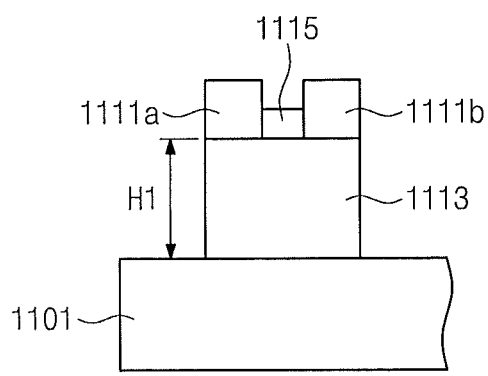
FIGS. 13A and 13B are cross sectional diagrams taken along section line G-G' of FIGS. 12A and 12B.
Figure 13B:
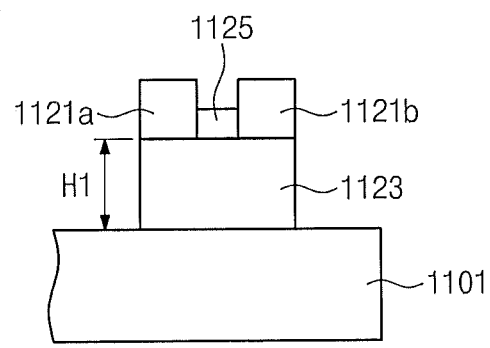

According to some embodiments, the first region of FIGS. 11A and 12A may be a memory cell array region and the second region of FIGS. 11B and 12B may be a peripheral circuit region. Accordingly, first gate electrode 1115 may be a word line, a memory cell storage node of a memory cell capacitor may be electrically coupled to source/drain region 1111a, and a bit line electrically may be electrically coupled to source/drain region 1111b. Moreover, first gate electrode 1115a, first fin 1113, and first and second source/drain regions 1111a and 1111b may define a memory cell transistor, and second gate electrode 1125, second fin 1123, and third and fourth source/drain regions 1121a and 1121b may define a peripheral circuit transistor.

While example embodiments of inventive concepts have been shown and described, it will be understood by one of ordinary skill in the art that variations in form and detail may be made therein without departing from the spirit and scope of the attached claims.

What is claimed is:

1. A semiconductor device comprising:
a substrate including a first region and a second region on a surface thereof;
a first semiconductor fin on the first region of the substrate wherein the first semiconductor fin includes a first trench therethrough;
a first gate electrode in the first trench;

first and second source/drain regions in the first semiconductor fin wherein the first gate electrode is between the first and second source/drain regions;
a second semiconductor fin on the second region of the substrate wherein the second semiconductor fin includes a second trench therethrough;
a second gate electrode in the second trench; and
third and fourth source/drain regions in the second semiconductor fin wherein the second gate electrode is between the third and fourth source/drain regions,
wherein the first region comprises a memory cell array region and the second region comprises a peripheral circuit region.

2. The semiconductor device of claim 1 wherein a depth of the second trench into the second semiconductor fin is less than a greatest height of the second semiconductor fin above the surface of the substrate, and wherein portions of the second gate electrode extend onto portions of sidewalls of the second semiconductor fin between the second trench and the surface of the substrate.

3. The semiconductor device of claim 2 further comprising:
an isolation layer on the second region of the substrate adjacent to the second semiconductor fin, wherein the second trench extends through the second semiconductor fin and through the isolation layer on opposite sides of the second semiconductor fin, and wherein a depth of the second trench in the isolation layer is greater than a depth of the second trench in the second semiconductor fin.

4. The semiconductor device of claim 2 wherein a depth of the first trench into the first semiconductor fin is less than a greatest height of the first semiconductor fin above the surface of the substrate, and wherein portions of the first gate electrode extend onto portions of sidewalls of the first semiconductor fin between the first trench and the surface of the substrate.

5. The semiconductor device of claim 4 further comprising:
an isolation layer on the first region of the substrate adjacent to the first semiconductor fin, wherein the first trench extends through the first semiconductor fin and through the isolation layer on opposite sides of the first semiconductor fin, and wherein a depth of the first trench in the isolation layer is greater than a depth of the first trench in the first semiconductor fin.

6. The semiconductor device of claim 1 wherein a width of the first trench is less than a width of the second trench, and/or wherein a width of the first gate electrode is less than a width of the second gate electrode.

7. The semiconductor device of claim 1 wherein a depth of the first trench in the first semiconductor fin is different than a depth of the second trench in the second semiconductor fin.

8. The semiconductor device of claim 7 wherein a depth of the first trench in the first semiconductor fin is greater than a depth of the second trench in the second semiconductor fin.

9. The semiconductor device of claim 1 wherein the second gate electrode is recessed in the second trench.

10. The semiconductor device of claim 1 wherein each of the first gate electrode and the second gate electrode comprises at least one metal containing layer.

11. The semiconductor device of claim 1 wherein the first gate electrode is recessed a first distance in the first trench, wherein the second gate electrode is recessed a second distance in the second trench, and wherein the first and second distances are different.

12. The semiconductor device of claim 1 wherein the first gate electrode comprises a material not included in the second gate electrode, and/or wherein the second gate electrode includes a material not included in the first gate electrode.

13. The semiconductor device of claim 1 further comprising:
a third semiconductor fin on the second region of the substrate wherein the third semiconductor fin includes a third trench therethrough;
a third gate electrode in the third trench; and
fifth and sixth source/drain regions in the third semiconductor fin wherein the third gate electrode is between the fifth and sixth source/drain regions.

14. The semiconductor device of claim 13 wherein a depth of the third trench into the third semiconductor fin is greater than a depth of the second trench into the second semiconductor fin.

15. The semiconductor device of claim 13 wherein a first peripheral circuit transistor is defined by the second gate electrode and the third and fourth source/drain regions, wherein the first peripheral circuit transistor has a first threshold voltage, wherein a second peripheral circuit transistor is defined by the third gate electrode and the fifth and sixth source/drain regions, wherein the second peripheral circuit transistor has a second threshold voltage, and wherein the first and second threshold voltages are different.

16. The semiconductor device of claim 13 wherein the second and third gate electrodes have different work functions.

17. The semiconductor device of claim 13 wherein the second gate electrode comprises a layer including lanthanum oxide, and wherein the third gate electrode comprises a layer including aluminum oxide.

18. The semiconductor device of claim 13 wherein the third and fourth source/drain regions comprise n-type source/drain regions, and wherein the fifth and sixth source/drain regions comprise p-type source/drain regions.

19. The semiconductor device of claim 18 wherein the third gate electrode has a work function that is higher than a work function of the second gate electrode.

20. The semiconductor device of claim 1 wherein the first semiconductor fin is aligned in a first direction, wherein the second semiconductor fin is aligned in a second direction, and wherein the first and second directions are non-parallel.

21. The semiconductor device of claim 1 wherein the first gate electrode comprises a word line, the semiconductor device further comprising:
a memory cell capacitor including a memory cell storage node electrically coupled to the first source/drain region; and
a bit line electrically coupled to the second source/drain region.

22. The semiconductor device of claim 1 wherein the first gate electrode and the first and second source/drain regions define a memory cell transistor, and wherein the second gate electrode and the third and fourth source/drain regions define a peripheral circuit transistor.

23. The semiconductor device of claim 1 wherein depths of the first and second source/drain regions into the first semiconductor fin are greater than a depth of the first trench into the first semiconductor fin.

24. A semiconductor memory device comprising:
a substrate including a first region and a second region on a surface thereof;
a first semiconductor fin on the first region of the substrate wherein the first semiconductor fin includes a first trench therethrough;

a first gate electrode in the first trench;

first and second source/drain regions in the first semiconductor fin wherein the first gate electrode is between the first and second source/drain regions, and wherein the first gate electrode and the first and second source/drain regions define a memory cell transistor;

a second semiconductor fin on the second region of the substrate wherein the second semiconductor fin includes a second trench therethrough;

a second gate electrode in the second trench;

third and fourth peripheral circuit source/drain regions in the second semiconductor fin wherein the second gate electrode is between the third and fourth peripheral circuit source/drain regions, and wherein the second gate electrode and the third and fourth source/drain regions define a first peripheral circuit transistor;

a third semiconductor fin on the second region of the substrate wherein the third semiconductor fin includes a third trench therethrough;

a third gate electrode in the third trench; and fifth and sixth source/drain regions in the third semiconductor fin wherein the third gate electrode is between the fifth and sixth source/drain regions, and wherein the third gate electrode and the fifth and sixth source/drain regions define a second peripheral circuit transistor.

25. The semiconductor memory device of claim 24 wherein a depth of the third trench into the third semiconductor fin is greater than a depth of the second trench into the second semiconductor fin.

26. The semiconductor memory device of claim 24 wherein the first peripheral circuit transistor defined by the second gate electrode and the third and fourth source/drain regions has a first threshold voltage, wherein the second peripheral circuit transistor defined by the third gate electrode and the fifth and sixth source/drain regions has a second threshold voltage, and wherein the first and second threshold voltages are different.

27. The semiconductor memory device of claim 24 wherein the second and third gate electrodes have different work functions.

28. The semiconductor memory device of claim 24 wherein the second gate electrode comprises a layer including lanthanum oxide, and wherein the third gate electrode comprises a layer including aluminum oxide.

29. The semiconductor memory device of claim 24 wherein the first gate electrode comprises a word line, the semiconductor device further comprising:

a memory cell capacitor including a memory cell storage node electrically coupled to the first source/drain region; and a bit line electrically coupled to the second source/drain region.

30. A semiconductor device comprising:

a substrate including a first region and a second region on a surface thereof;

a first semiconductor fin on the first region of the substrate;

a first gate electrode extending across the first semiconductor fin;

first and second raised source/drain regions on the first semiconductor fin wherein the first gate electrode is between the first and second raised source/drain regions;

a second semiconductor fin on the second region of the substrate, wherein heights of the first and second fins are different;

a second gate electrode extending across the second semiconductor fin, wherein work functions of the first and second gate electrodes are different; and third and fourth raised source/drain regions on the second semiconductor fin wherein the second gate electrode is between the third and fourth raised source/drain regions.

* * * * *